(12) United States Patent
Jang et al.

(10) Patent No.: US 11,462,286 B2
(45) Date of Patent: Oct. 4, 2022

(54) MEMORY AND OPERATION METHOD OF MEMORY

(71) Applicant: SK hynix Inc., Gyeonggi-do (KR)

(72) Inventors: Munseon Jang, San Jose, CA (US); Hoiju Chung, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/354,423

(22) Filed: Jun. 22, 2021

(65) Prior Publication Data

US 2021/0398600 A1 Dec. 23, 2021

Related U.S. Application Data

(60) Provisional application No. 63/174,824, filed on Apr. 14, 2021, provisional application No. 63/042,238, filed on Jun. 22, 2020.

(51) Int. Cl.
*G11C 29/02* (2006.01)
*G11C 29/12* (2006.01)
*G11C 29/00* (2006.01)
*G11C 29/24* (2006.01)

(52) U.S. Cl.
CPC ........ *G11C 29/026* (2013.01); *G11C 29/1201* (2013.01); *G11C 29/24* (2013.01); *G11C 29/702* (2013.01); *G11C 2029/1204* (2013.01)

(58) Field of Classification Search
CPC ... G11C 29/026; G11C 29/1201; G11C 29/24; G11C 29/702; G11C 2029/1204
See application file for complete search history.

(56) References Cited

U.S. PATENT DOCUMENTS

| | | | |
|---|---|---|---|
| 10,387,047 B2 | 8/2019 | Shiah et al. | |
| 2002/0012282 A1* | 1/2002 | Saito | G11C 16/26 365/200 |
| 2009/0207642 A1* | 8/2009 | Shimano | G11C 11/1675 365/72 |
| 2016/0180965 A1* | 6/2016 | Lee | G11C 7/06 365/201 |

* cited by examiner

*Primary Examiner* — Mohammed A Bashar
(74) *Attorney, Agent, or Firm* — IP & T Group LLP

(57) ABSTRACT

A method for operating a memory includes: activating a first row, and sensing and amplifying, by a first bit line sense amplifier array, data of memory cells of the first row; transferring data of first columns of the first row from the first bit line sense amplifier array to global input/output lines through first input/output sense amplifiers; storing data of the global input/output lines in the first columns of a dummy bit line sense amplifier array through dummy write drivers; transferring data of second columns of the first row from the first bit line sense amplifier array to the global input/output lines through the first input/output sense amplifiers; and storing the data of the global input/output lines in the second columns of the dummy bit line sense amplifier array through the dummy write drivers.

11 Claims, 4 Drawing Sheets

MEMORY AND OPERATION METHOD OF MEMORY

CROSS-REFERENCE TO RELATED APPLICATIONS

The present application claims priority of U.S. Provisional Application No. 63/042,238 filed on Jun. 22, 2020 and U.S. Provisional Application No. 63/174,824 filed on Apr. 14, 2021, which is incorporated herein by reference in its entirety.

BACKGROUND

1. Field

Various embodiments of the present invention relate to a memory.

2. Description of the Related Art

Typically, a memory, such as a Dynamic Random Access Memory (DRAM), goes through a test process to detect a defect of the memory, after it is designed and fabricated.

If there is at least one defect in a great deal of memory cells of a memory, the memory cannot perform the desired function properly but is treated as a defective product. However, when there are only a few defective memory cells, it is inefficient in terms of yield to treat the memory as a defective memory. To address this problem, a method of providing redundant memory cells in the memory in a fabrication stage of the memory and replacing the defective memory cells of the memory with the redundant memory cells after the fabrication stage.

Post-package repair means repairing a memory after a package process. The post-package repair may be performed not only in the fabrication process of the memory, but also in the process when the memory is used by a user. In order to perform a post-package repair operation on the memory in use, it is preferable to copy the data of the defective memory cell into a redundant memory cell within the memory in use.

SUMMARY

Embodiments of the present invention are directed to a technique of internally copying data in a memory.

In accordance with an embodiment of the present invention, a method for operating a memory includes: activating a first row, and sensing and amplifying, by a first bit line sense amplifier array, data of memory cells of the first row; transferring data of first columns of the first row from the first bit line sense amplifier array to global input/output lines through first input/output sense amplifiers; storing data of the global input/output lines in the first columns of a dummy bit line sense amplifier array through dummy write drivers; transferring data of second columns of the first row from the first bit line sense amplifier array to the global input/output lines through the first input/output sense amplifiers; and storing the data of the global input/output lines in the second columns of the dummy bit line sense amplifier array through the dummy write drivers.

In accordance with another embodiment of the present invention, a memory includes: a first cell array; a second cell array; a first bit line sense amplifier array suitable for sensing and amplifying data of the first cell array; a second bit line sense amplifier array suitable for sensing and amplifying data of the second cell array; a dummy bit line sense amplifier array; global input/output lines; a first bus exchange circuit suitable for exchanging transferring data between the global input/output lines and local lines of the first bit line sense amplifier array; a second bus exchange circuit suitable for exchanging transferring data between the global input/output lines and local lines of the second bit line sense amplifier array; and a dummy bus exchange circuit suitable for exchanging transferring data between the global input/output lines and local lines of the dummy bit line sense amplifier array.

In accordance with yet another embodiment of the present invention, a semiconductor memory apparatus includes: a storage circuit including: first and second rows of memory cells, first and second bit line sense amplifier arrays coupled to the memory cells of the respective first and second rows in a column direction, and a buffer array coupled to the first and second bit line sense amplifier arrays; and a control circuit suitable for controlling the storage circuit to: copy data from the first row to the buffer array through the first bit line sense amplifier array, copy data from the buffer array to the second row through the second bit line sense amplifier array, and perform a repair operation of replacing the first row with the second row, wherein the first and second bit line sense amplifier arrays and the buffer array have the same data storage structure as one another.

In accordance with still another embodiment of the present invention, a semiconductor memory apparatus includes: a storage circuit including: first and second rows of memory cells, a bit line sense amplifier array coupled to the memory cells of the first and second rows in column direction, and a buffer array coupled to the bit line sense amplifier array; and a control circuit suitable for controlling the storage circuit to: copy data from the first row to the buffer array through the bit line sense amplifier array, copy data from the buffer array to the second row through the bit line sense amplifier array, and perform a repair operation of replacing the first row with the second row, wherein the bit line sense amplifier array and the buffer array have the same data storage structure as each other.

DETAILED DESCRIPTION

Figure 1:
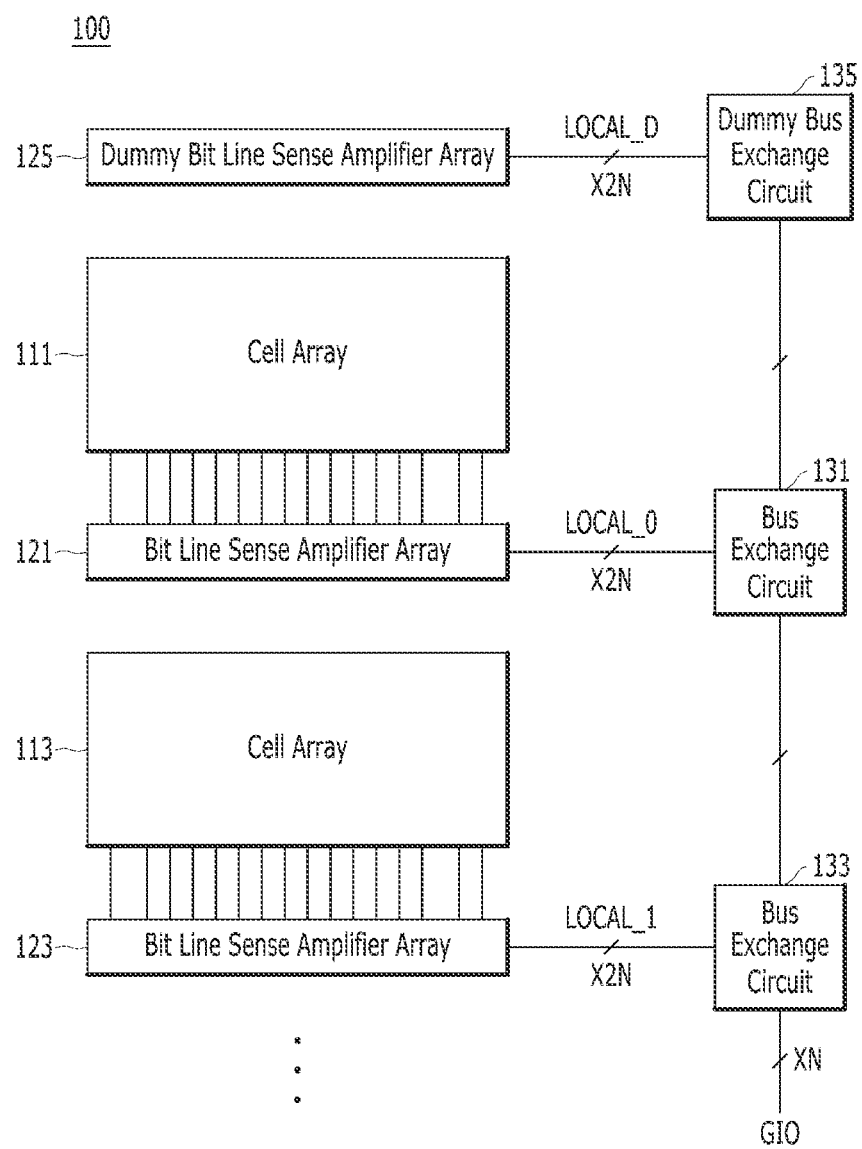
FIG. 1 is a block diagram illustrating a memory 100 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory 100 in accordance with an embodiment of the present invention.

Referring to FIG. 1, the memory 100 may include cell arrays 111 and 113, bit line sense amplifier arrays 121 and 123, a dummy bit line sense amplifier array 125, bus exchange circuits 131 and 133, and a dummy bus exchange circuit 135.

Each of the cell arrays 111 and 113 may include memory cells that are arranged in a plurality of rows and a plurality of columns. Although two cell arrays 111 and 113 are shown in the figure as an example, a large number of cell arrays may exist in the memory 100.

The bit line sense amplifier arrays 121 and 123 may sense and amplify the data of the cell arrays 111 and 113. The bit line sense amplifier array 121 may sense and amplify the data of the cell array 111, and the bit line sense amplifier array 123 may sense and amplify the data of the cell array 113.

The dummy bit line sense amplifier array 125 may be formed the same as the bit line sense amplifier arrays 121 and 123. During a data copy operation, the dummy bit line sense amplifier array 125 may serve as a buffer rather than sensing and amplifying data of a cell array. The dummy bit line sense amplifier array 125 may be positioned at an edge of a region where the cell arrays 111 and 113 are disposed.

The bus exchange circuit 131 may be provided for data exchange between the global input/output lines GIO and the local lines LOCAL_0 on the side of the bit line sense amplifier array 121. The global input/output lines GIO may include N lines, where N is an integer equal to or greater than 2, and the local lines LOCAL_0 may include 2N lines. The global input/output lines GIO may transfer data in a single-ended method, and the local lines LOCAL_0 may transfer data in a differential method. For this reason, the number of the local lines LOCAL_0 may be twice as many as the number of the global input/output lines GIO. The global input/output lines GIO may be lines for transferring data between an area where data are transferred/received between the memory 100 and the outside and areas where data are stored in the memory 100.

The bus exchange circuit 133 may be provided for data exchange between the global input/output lines GIO and the local lines LOCAL_1 on the side of the bit line sense amplifier array 123. Also, the dummy bus exchange circuit 135 may be provided for data exchange between the global input/output lines GIO and the local lines LOCAL_D on the side of the dummy bit line sense amplifier array 125. The dummy bus exchange circuit 135 may be formed the same as the bus exchange circuits 131 and 133.

Figure 2:
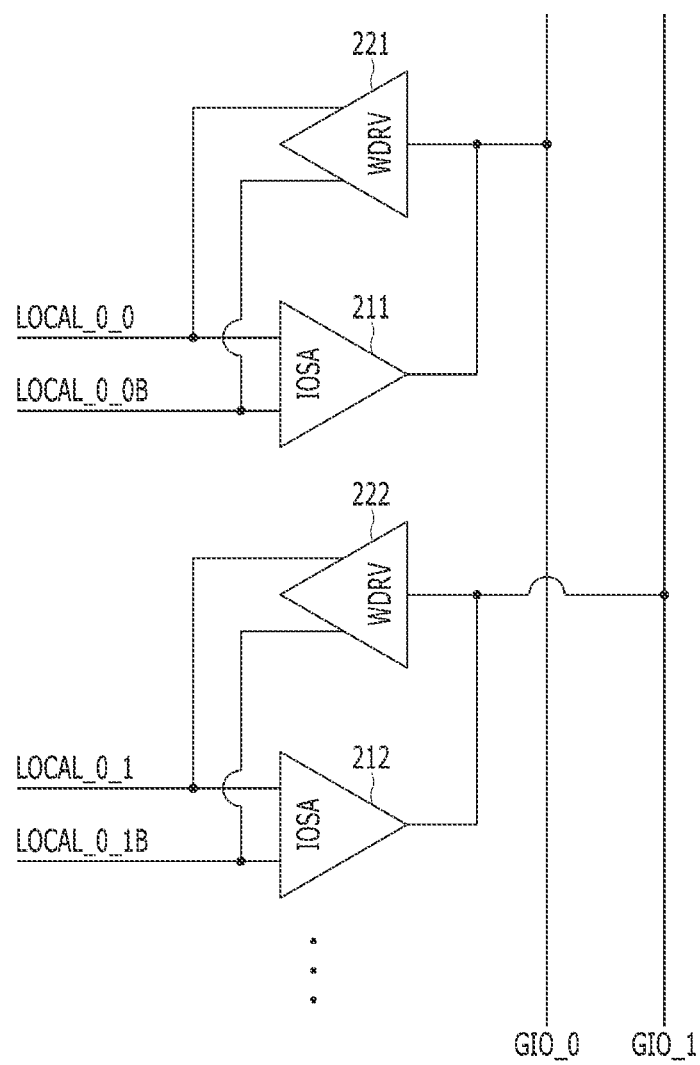
FIG. 2 is a block diagram illustrating a bus exchange circuit 131 shown in FIG. 1 in accordance with an embodiment of the present invention.

FIG. 2 is a block diagram illustrating the bus exchange circuit 131 shown in FIG. 1 in accordance with an embodiment of the present invention.

Referring to FIG. 2, the bus exchange circuit 131 may include a plurality of input/output sense amplifiers (IOSA) 211 and 212 and a plurality of write drivers (WDRV) 221 and 222.

The input/output sense amplifiers 211 and 212 may transfer the data of the local lines LOCAL_0 to the global input/output lines GIO. The input/output sense amplifiers 211 and 212 may be used during a read operation of the memory 100 and a data copy operation, which will be described later. The input/output sense amplifier 211 may amplify the data of the local lines LOCAL_0_0 and LOCAL_0_0B and transfer the amplified data to the global input/output line GIO_0. Also, the input/output sense amplifier 212 may amplify the data of the local lines LOCAL_0_1 and LOCAL_0_1B and transfer the amplified data to the global input/output line GIO_1. The number of input/output sense amplifiers 211 and 212 may be the same as the number of the global input/output lines GIO.

The write drivers 221 and 222 may transfer the data of the global input/output lines GIO to the local lines LOCAL_0. The write drivers 221 and 222 may be used during a write operation of the memory 100 and a data copy operation, which will be described later. The write driver 221 may amplify the data of the global input/output line GIO_0 and transfer the amplified data to the local lines LOCAL_0_0 and LOCAL_0_1B. Also, the write driver 222 may amplify the data of the global input/output line GIO_1 and transfer the amplified data to the local lines LOCAL_0_1 and LOCAL_0_1B. The number of the write drivers 221 and 222 may be the same as the number of the global input/output lines GIO.

The bus exchange circuit 133 and the dummy bus exchange circuit 135 may be formed the same as the bus exchange circuit 131 shown in FIG. 2.

Figure 3:
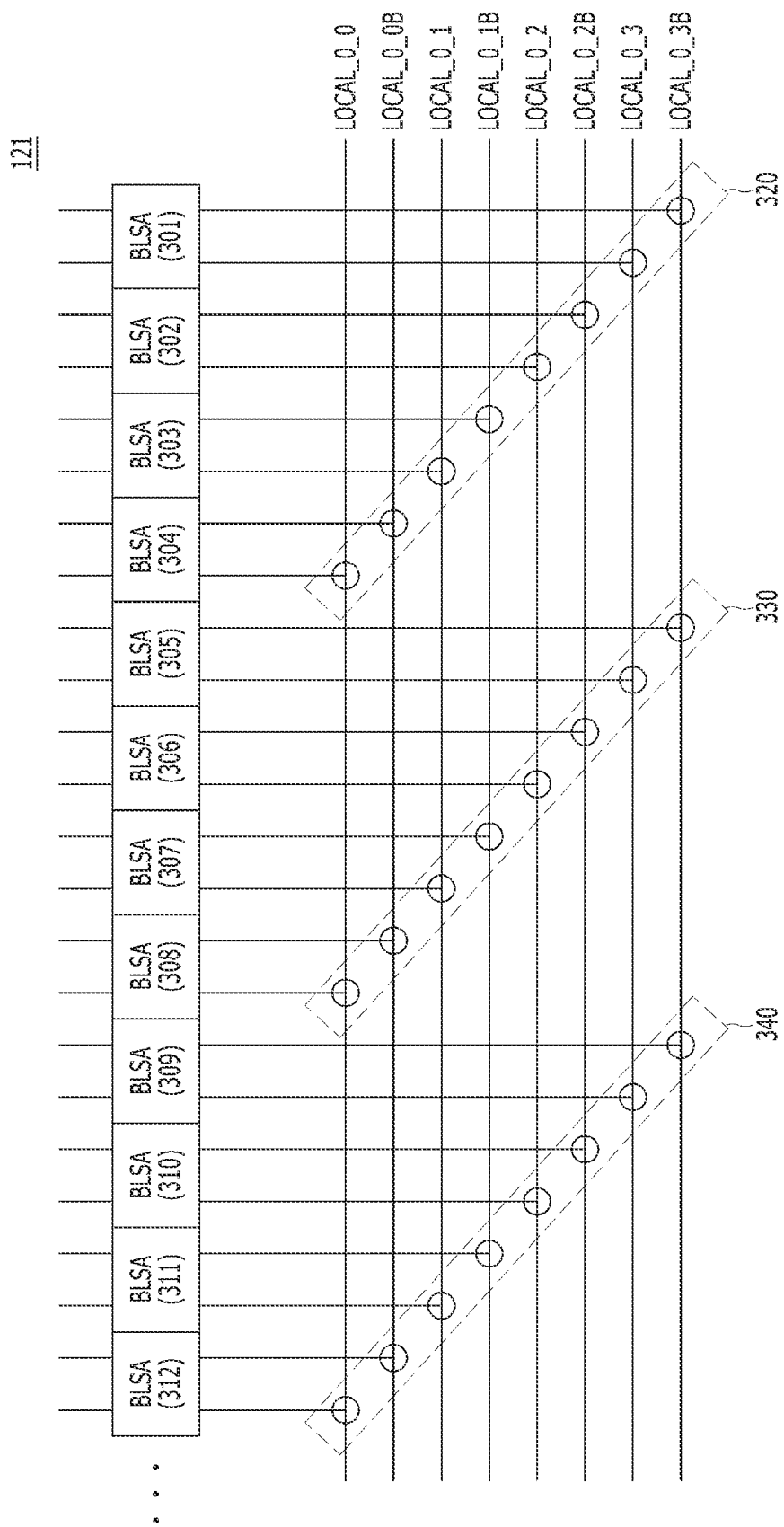
FIG. 3 is a block diagram illustrating a bit line sense amplifier array 121 shown in FIG. 1 in accordance with an embodiment of the present invention.

FIG. 3 is a block diagram illustrating the bit line sense amplifier array 121 shown in FIG. 1 in accordance with an embodiment of the present invention.

Referring to FIG. 3, the bit line sense amplifier array 121 may include a plurality of sense amplifiers 301 to 312 and a plurality of switch arrays 320, 330 and 340. Herein, it is illustrated that the number of the local lines LOCAL_0_0 and LOCAL_0_0B to LOCAL_0_3 and LOCAL_0_3B is eight however any number of local lines may be used.

The switch arrays 320, 330, and 340 may control the coupling between the local lines LOCAL_0_0 and LOCAL_0_0B to LOCAL_0_3 and LOCAL_0_3B and the bit line sense amplifiers 301 to 312. Each of the switch arrays 320, 330, and 340 may include eight switches. Among the switch arrays 320, 330, and 340, a switch array selected based on a column address may be turned on. When the switch array 320 is turned on, the local lines LOCAL_0_0 and LOCAL_0_0B to LOCAL_0_3 and LOCAL_0_3B and the bit line sense amplifiers 301 to 304 may be electrically connected to transfer data. When the switch array 330 is turned on, the local lines LOCAL_0_0 and LOCAL_0_0B to LOCAL_0_3 and LOCAL_0_3B and the bit line sense amplifiers 305 to 308 may be electrically connected to transfer data. Likewise, when the switch array 340 is turned on, the local lines LOCAL_0_0 and LOCAL_0_0B to LOCAL_0_3 and LOCAL_0_3B and the bit line sense amplifiers 309 to 312 may be electrically connected to transfer data.

Each of the bit line sense amplifiers 301 to 312 may sense and amplify a potential difference between both ends of a bit line pair. In the figure, the lines extending to the top of the bit line sense amplifiers 301 to 312 may represent bit lines.

The bit line sense amplifier array 123 may be formed the same as the bit line sense amplifier array 121 shown in FIG. 3. The dummy bit line sense amplifier array 125 may be formed the same as the bit line sense amplifier array 121, except that the bit lines are not coupled.

Referring to FIGS. 1 to 3, the memory 100 is illustrated to have a folded bit line structure, but the memory 100 may also have an open bit line structure, instead of a folded bit line structure.

Figure 4:
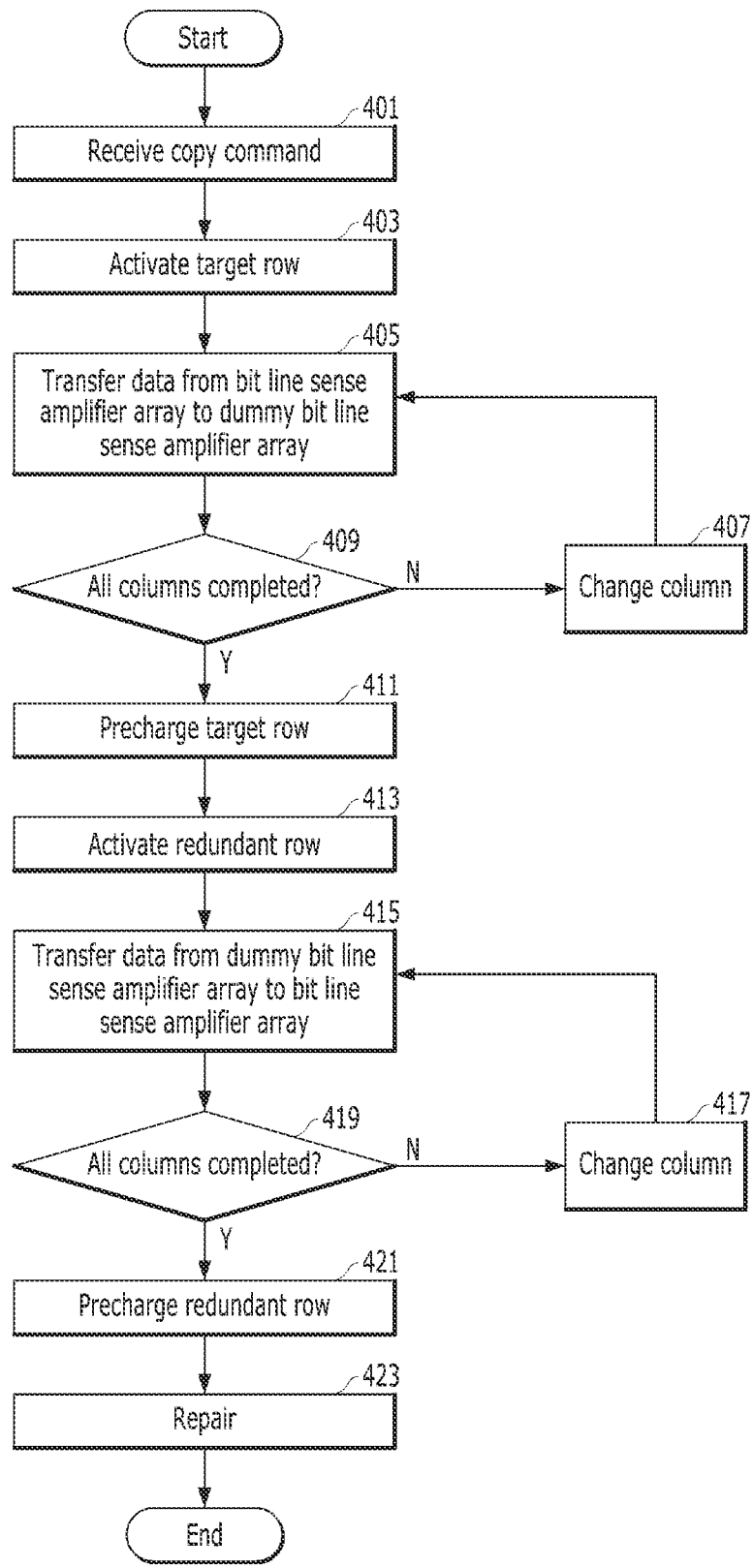
FIG. 4 is a flowchart describing a process of copying data of one row of the cell array 111 into another row of the cell array 113 in accordance with an embodiment of the present invention.

FIG. 4 is a flowchart describing a process of copying data of one row of the cell array 111 into another row of the cell array 113 in accordance with an embodiment of the present invention. A data copy operation may be used to copy the data of a defective row into a redundant row and may be used in other cases. Hereinafter, a process of performing a repair operation in which the data of a defective row are copied into a redundant row and the defective row is replaced with the redundant row will be described. The process illustrated in FIG. 4 may be performed by the memory 100 under the control of a memory controller (not illustrated).

Referring to FIG. 4, the memory 100 may receive a command commanding to copy data in operation 401. Along with the command commanding data copying, an address designating a defective row and an address designating a redundant row into which the data of the defective row are to be moved may be received.

A target row may be activated in operation 403. The target row may mean a defective row whose data are required to be copied. A row in which a defect is detected during the operation of the memory 100 may become a target row. Herein, the target row is a fifth row of the cell array 111. The fifth row may be activated in the cell array 111, and the data stored in the memory cells of the fifth row may be sensed and amplified by the bit line sense amplifiers of the bit line sense amplifier array 121. When the target row is activated, the bit line sense amplifiers of the dummy bit line sense amplifier array 125 may also be activated.

The data of the bit line sense amplifier array 121 may be moved to and stored in the dummy bit line sense amplifier array 125 in operation 405. The data of the bit line sense amplifier array 121 may be transferred to the global input/output lines GIO through the input/output sense amplifiers 211 and 212 of the bus exchange circuit 131, and the data of the global input/output lines GIO may be transferred to and stored in the dummy bit line sense amplifier array 125 through the write drivers of the dummy bus exchange circuit 135.

The entire data of the bit line sense amplifier array 121 may not be moved to and stored in the dummy bit line sense amplifier array 125 at once. This is because there is a limit to the number of the input/output sense amplifiers in the bus exchange circuit, the global input/output lines, and the write drivers of the dummy bus exchange circuit. Data of the bit line sense amplifiers corresponding to one switch array (e.g., the array 320 of FIG. 3) among the switch arrays (e.g., the arrays 320 to 340 of FIG. 3) may be moved from the bit line sense amplifier array 121 at a time.

An operation of moving and storing the data of the bit line sense amplifier array 121 to and in the dummy bit line sense amplifier array 125 may be performed several times while changing a column address through operation 407.

When all data of the bit line sense amplifier array 121 are moved to the dummy bit line sense amplifier array 125, that is, when the operation of moving the data of all columns is completed (Y in operation S409), the target row may be precharged in operation 411. When the target row (e.g., the fifth row) is precharged, the target row may be deactivated and the bit line sense amplifier array 121 may be deactivated. In other words, the bit line sense amplifiers 301 to 312 of the bit line sense amplifier array 121 may be deactivated.

Now, the redundant row of the cell array 113 may be activated in operation 413. A redundant row may mean an extra row to replace a defective row. When the redundant row is activated in the cell array 113, the data stored in the memory cells of the redundant row may be sensed and amplified by the bit line sense amplifiers of the bit line sense amplifier array 123.

Now, the data of the dummy bit line sense amplifier array 125, that is, the data copied from the target row, may be moved to and stored in the bit line sense amplifier array 123 in operation 415. The data of the dummy bit line sense amplifier array 125 may be transferred to the global input/output lines GIO through the input/output sense amplifiers of the dummy bus exchange circuit 135, and the data of the global input/output lines GIO may be transferred to and stored in the bit line sense amplifier array 123 through the write drivers 221 and 222 of the bus exchange circuit 133. Since the redundant row is activated in the cell array 113, the data of the bit line sense amplifier array 123 may be directly written into the redundant row of the cell array 113.

Since the entire data of the dummy bit line sense amplifier array 125 cannot be moved to and stored in the bit line sense amplifier array 123 at one time, the operation of moving the data of the dummy bit line sense amplifier array 125 into the bit line sense amplifier array may be performed several times while changing the column address through operation 417.

When all data of the dummy bit line sense amplifier array 125 are moved to the bit line sense amplifier array 123, that is, when the operation of moving the data of all columns is completed (Y in operation S419), the redundant row of the cell array 113 may be precharged in operation 421. When the redundant row is precharged in the cell array 113, the redundant row may be deactivated, and the bit line sense amplifiers of the bit line sense amplifier array 123 may be deactivated. Also, the dummy bit line sense amplifier array 125 may be deactivated. In short, the bit line sense amplifiers in the dummy bit line sense amplifier array 125 may be deactivated.

A repair operation of replacing the target row of the cell array 111 with the redundant row of the cell array 113 may be performed in operation 423 since all the data of the defective target row in the cell array 111 are copied into the redundant row of the cell array 113. This repair operation may be a post package repair (PPR) operation.

In FIG. 4, an operation of copying the data of the target row of the cell array 111 into the redundant row of the cell array 113 is described. That is, the operation of copying data between different cell arrays 111 and 113 is described. This operation can also be performed within the same cell arrays.

The operation of copying the data of the target row of the cell array 111 into the redundant row of the cell array 111 may include (1) activating the target row of the cell array 111 and sensing and amplifying data of the target row by using the bit line sense amplifier array 121, (2) moving the data of the bit line sense amplifier array 121 to the dummy bit line sense amplifier array 125, (3) precharging the target row of the cell array 111, (4) activating the redundant row of the cell array 111 and sensing and amplifying data of the redundant row by using the bit line sense amplifier array 121, (5) moving the data of the dummy bit line sense amplifier array 125 to the bit line sense amplifier array 121, and (6) precharging the redundant row of the cell array 111.

Also, the operation of copying the data of the target row of the cell array 113 to the redundant row of the cell array 113 may include (1) activating the target row of the cell array 113 and sensing and amplifying data of the target row by using the bit line sense amplifier array 123, (2) moving the data of the bit line sense amplifier array 123 to the dummy bit line sense amplifier array 125, (3) precharging the target row of the cell array 113, (4) activating the redundant row of the cell array 113 and sensing and amplifying data of the redundant row by using the bit line sense amplifier array 123, (5) moving the data of the dummy bit line sense amplifier array 125 to the bit line sense amplifier array 123, and (6) precharging the redundant row of the cell array 113.

According to the embodiments of the present invention, it is possible to easily copy the data of a particular row to another row in a memory. Therefore, even though a defective row is detected in the memory, the memory may be repaired without losing data by performing a repair operation of copying the data of the defective row into the redundant row, and replacing the defective row with a redundant row.

According to the embodiment of the present invention, data may be efficiently copied internally in a memory.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A method for operating a memory, comprising:
activating a first row, and sensing and amplifying, by a first bit line sense amplifier array, data of memory cells of the first row;
transferring data of first columns of the first row from the first bit line sense amplifier array to global input/output lines through first input/output sense amplifiers;
storing data of the global input/output lines transferred from the first bit line sense amplifier array in the first columns of a dummy bit line sense amplifier array through dummy write drivers;
transferring data of second columns of the first row from the first bit line sense amplifier array to the global input/output lines through the first input/output sense amplifiers; and
storing the data of the global input/output lines transferred from the first bit line sense amplifier array in the second columns of the dummy bit line sense amplifier array through the dummy write drivers.

2. The method of claim 1, further comprising:
precharging the first row;
activating a second row, and sensing and amplifying, by the first bit line sense amplifier array, data of memory cells of the second row;
transferring the data of the first columns of the dummy bit line sense amplifier array to the global input/output lines through dummy input/output sense amplifiers;
storing the data of the global input/output lines in the first columns of the first bit line sense amplifier array through first write drivers;
writing the data of the first columns of the first bit line sense amplifier array to the memory cells of the first columns of the second row;
transferring the data of the second columns of the dummy bit line sense amplifier array to the global input/output lines through the dummy input/output sense amplifiers;
storing the data of the global input/output lines in the second columns of the first bit line sense amplifier array through the first write drivers; and
writing the data of the second columns of the first bit line sense amplifier array to the memory cells of the second columns of the second row.

3. The method of claim 1, further comprising:
precharging the first row;
activating a second row, and sensing and amplifying, by a second bit line sense amplifier array, data of memory cells of the second row;
transferring the data of the first columns of the dummy bit line sense amplifier array to the global input/output lines through dummy input/output sense amplifiers;
storing data of the global input/output lines in the first columns of the second bit line sense amplifier array through second write drivers;
writing the data of the first columns of the second bit line sense amplifier array to the memory cells of the first columns of the second row;
transferring the data of the second columns of the dummy bit line sense amplifier array to the global input/output lines through the dummy input/output sense amplifiers;
storing the data of the global input/output lines in the second columns of the second bit line sense amplifier array through the second write drivers; and
writing the data of the second columns of the second bit line sense amplifier array to the memory cells of the second columns of the second row.

4. The method of claim 3, wherein the first row is a row in which a defect is detected, and the second row is a redundant row for replacing the first row.

5. The method of claim 4, further comprising, after the writing the data of the second columns:
precharging the second row; and
replacing the first row with the second row.

6. The method of claim 3, further comprising maintaining the dummy bit line sense amplifier array in an activated state from the activating of the first row to the writing of the data of the second columns.

7. A memory, comprising:
a first cell array;
a second cell array;
a first bit line sense amplifier array configured to sense and amplify data of the first cell array;
a second bit line sense amplifier array configured to sense and amplify data of the second cell array;
a dummy bit line sense amplifier array;
global input/output lines;
a first bus exchange circuit configured to transfer data between the global input/output lines and local lines of the first bit line sense amplifier array;
a second bus exchange circuit configured to transfer data between the global input/output lines and local lines of the second bit line sense amplifier array; and
a dummy bus exchange circuit configured to transfer data between the global input/output lines and local lines of the dummy bit line sense amplifier array,
wherein the first bit line sense amplifier array, the first bus exchange circuit, the global input/output lines, and the dummy bus exchange circuit transfer the data of the first row of the first cell array to the dummy bit line sense amplifier array, and
wherein the dummy bus exchange circuit, the global input/output lines, the second bus exchange circuit, and the second bit line sense amplifier array transfer the data of the dummy bit line sense amplifier array to the second row of the second cell array.

8. A memory, comprising:
a first cell array;
a second cell array;
a first bit line sense amplifier array configured to sense and amplify data of the first cell array;
a second bit line sense amplifier array configured to sense and amplify data of the second cell array;
a dummy bit line sense amplifier array;
global input/output lines;

a first bus exchange circuit configured to transfer data between the global input/output lines and local lines of the first bit line sense amplifier array;

a second bus exchange circuit configured to transfer data between the global input/output lines and local lines of the second bit line sense amplifier array; and a dummy bus exchange circuit configured to transfer data between the global input/output lines and local lines of the dummy bit line sense amplifier array, wherein the first bit line sense amplifier array, the first bus exchange circuit, the global input/output lines, and the dummy bus exchange circuit transfer the data of the first row of the first cell array to the dummy bit line sense amplifier array, and wherein the dummy bus exchange circuit, the global input/output lines, the first bus exchange circuit, and the first bit line sense amplifier array transfer the data of the dummy bit line sense amplifier array to the second row of the first cell array.

9. The memory of claim 7, wherein each of the first bus exchange circuit, the second bus exchange circuit, and the dummy bus exchange circuit includes:

a plurality of input/output sense amplifiers; and a plurality of write drivers.

10. The memory of claim 7, wherein the first row of the first cell array is a row in which a defect is detected, and the second row of the second cell array is a redundant row for replacing the first row.

11. The memory of claim 7, wherein after the transfer of the data from the first row of the first cell array to the second row of the second cell array is completed, the first row of the first cell array is replaced with the second row of the second cell array.

* * * * *